(12) United States Patent
Morita et al.

(10) Patent No.: US 7,960,225 B1
(45) Date of Patent: Jun. 14, 2011

(54) METHOD OF CONTROLLING FILM THINNING OF SEMICONDUCTOR WAFER FOR SOLID-STATE IMAGE SENSING DEVICE

(75) Inventors: Etsurou Morita, Tokyo (JP); Akihiko Endo, Tokyo (JP); Yoshihisa Nonogaki, Tokyo (JP); Hideki Nishihata, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 12/869,894

(22) Filed: Aug. 27, 2010

(30) Foreign Application Priority Data

Aug. 31, 2009 (JP) .................................. 2009-201136

(51) Int. Cl.
*H01L 21/8238* (2006.01)
(52) U.S. Cl. ................................. 438/199; 257/E27.133
(58) Field of Classification Search .................. 438/199, 438/202; 257/E27.133
See application file for complete search history.

(56) References Cited

U.S. PATENT DOCUMENTS

| | | | |
|---|---|---|---|
| 6,723,594 B2 * | 4/2004 | Rhodes | 438/200 |
| 7,413,944 B2 * | 8/2008 | Lee | 438/199 |
| 7,622,342 B2 * | 11/2009 | Swain et al. | 438/199 |
| 2003/0087503 A1 * | 5/2003 | Sakaguchi et al. | 438/406 |
| 2005/0139828 A1 | 6/2005 | Maruyama et al. | |
| 2007/0155083 A1 * | 7/2007 | Park | 438/199 |
| 2008/0213938 A1 * | 9/2008 | Kao | 438/69 |

FOREIGN PATENT DOCUMENTS

| | | | |
|---|---|---|---|
| JP | 2005-353996 | | 12/2005 |
| JP | 2005353996 A | * | 12/2005 |
| JP | 4046067 | | 2/2008 |
| JP | 2008-258201 | | 10/2008 |

* cited by examiner

*Primary Examiner* — Thao P. Le
(74) *Attorney, Agent, or Firm* — Greenblum & Bernstein, P.L.C.

(57) ABSTRACT

The thickness of a semiconductor wafer layer, extending from a mirror-finished surface thereof to a solid-state image sensing device, is measured. Based on the residual thickness data, plasma etching is performed from the mirror-finished surface until a predetermined thickness is reached by controlling the plasma etching amount. By doing this, it is possible to reduce variation in the thickness of the solid-state image sensing device at low cost without causing an increase in the number of processes.

6 Claims, 6 Drawing Sheets

[Fig. 1a]
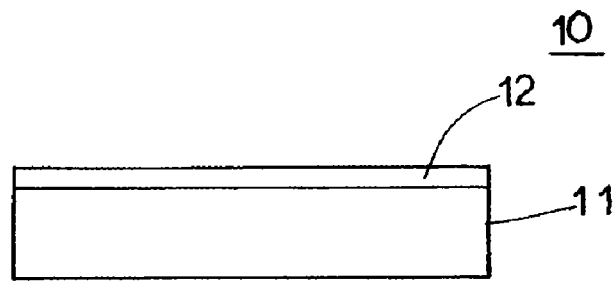
[Fig. 1b]
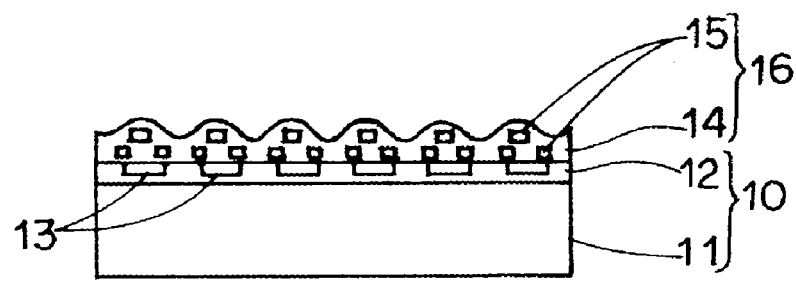
[Fig. 1c]
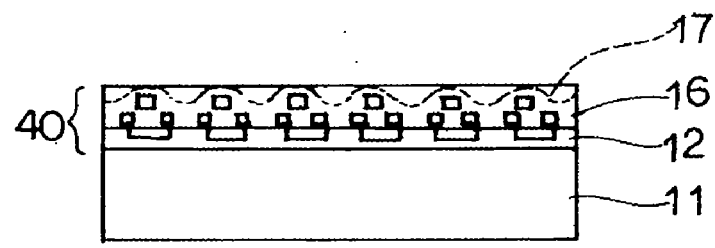
[Fig. 1d]
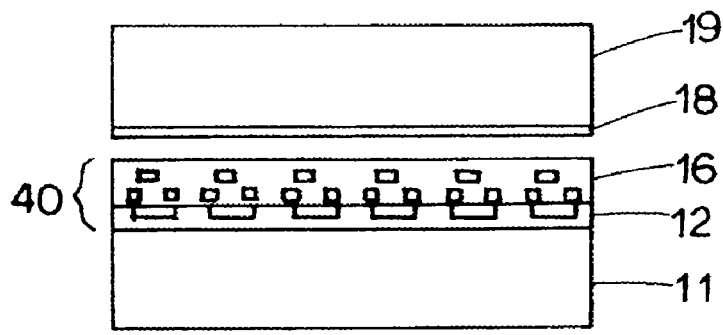

[Fig. 1e]
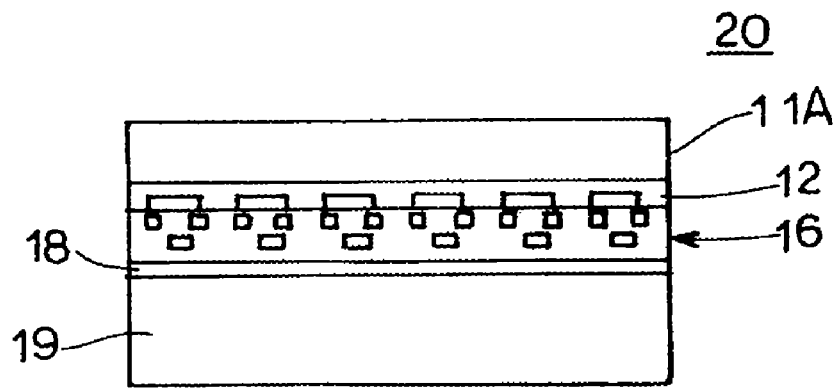
[Fig. 1f]
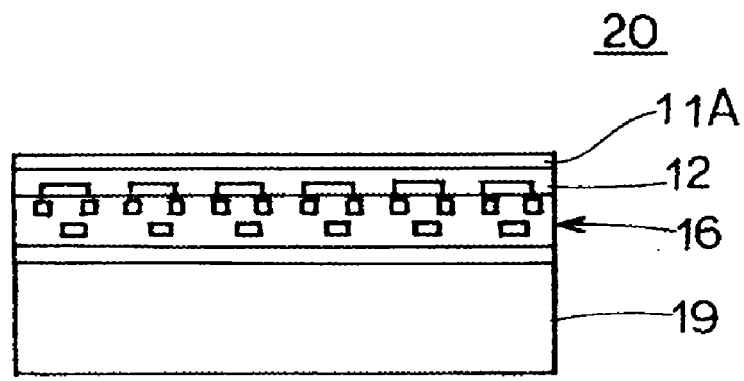
[Fig. 1g]
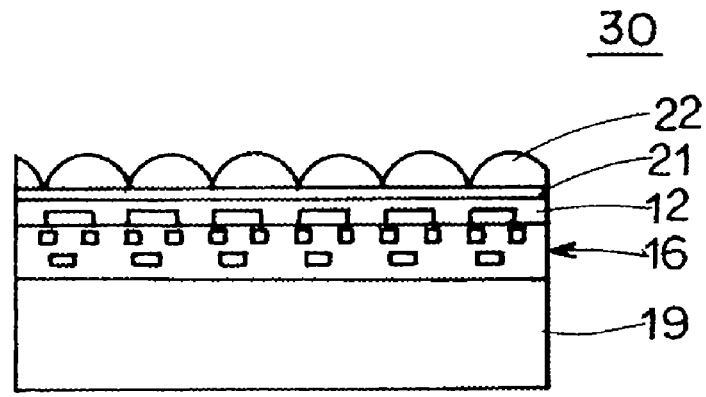

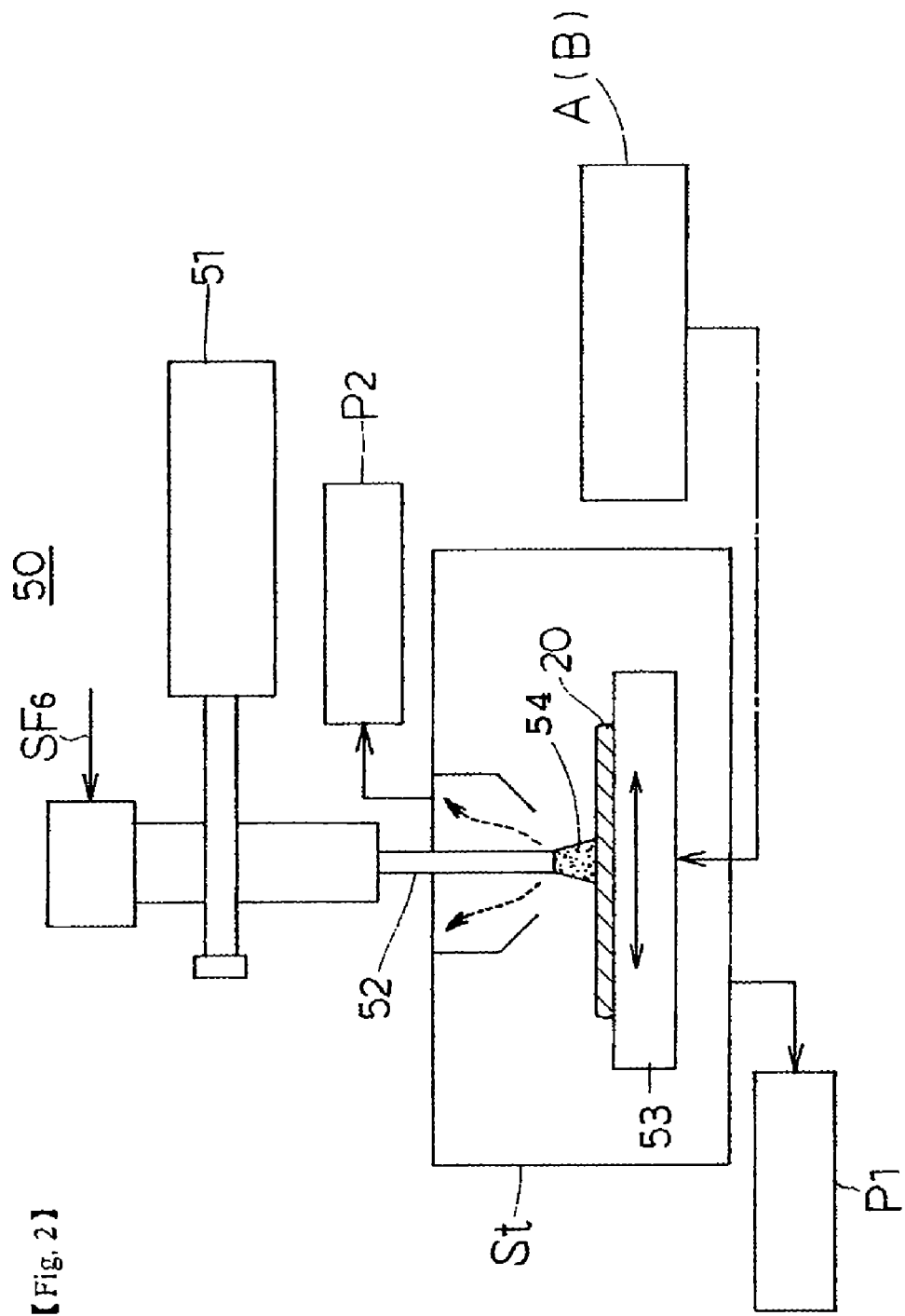

[Fig. 3]
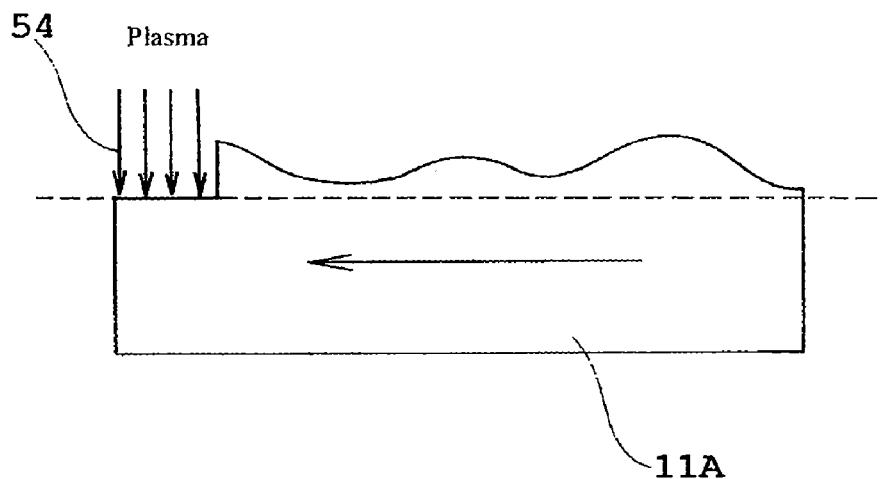
[Fig. 4a]
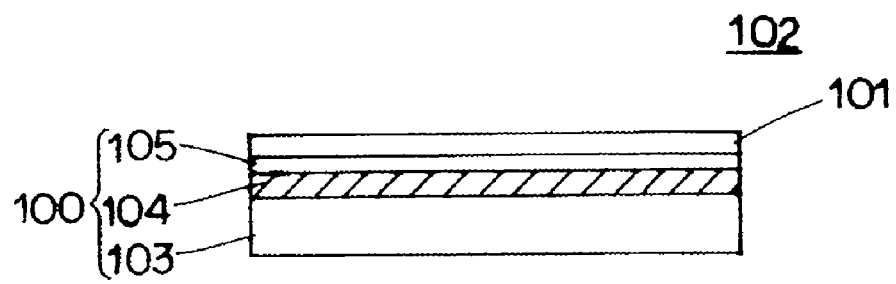
[Fig. 4b]
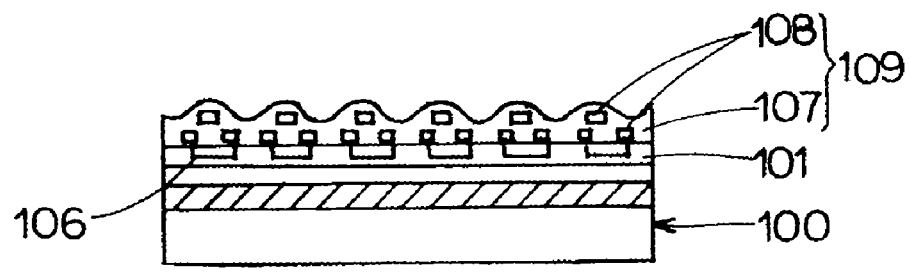

[Fig. 4c]
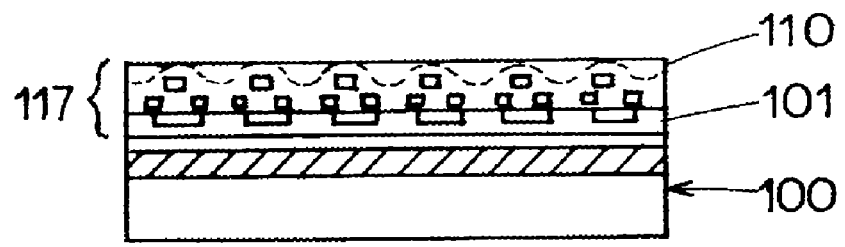
[Fig. 4d]
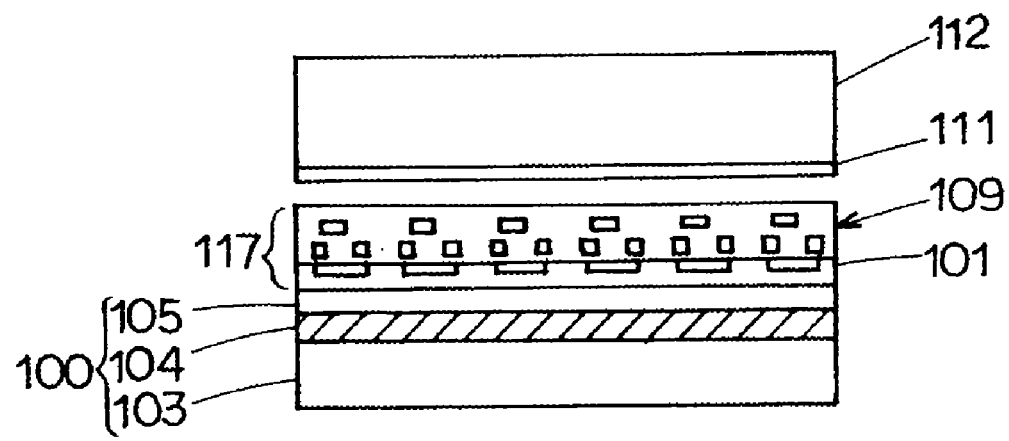
[Fig. 4e]
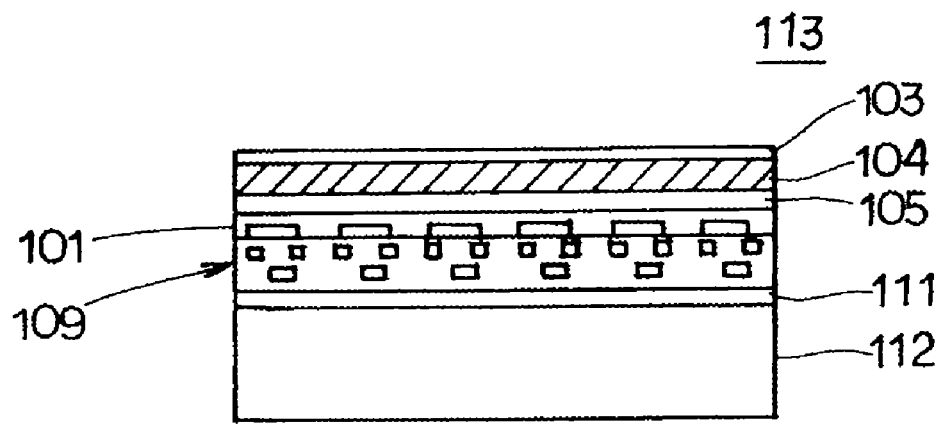

[Fig. 4f]
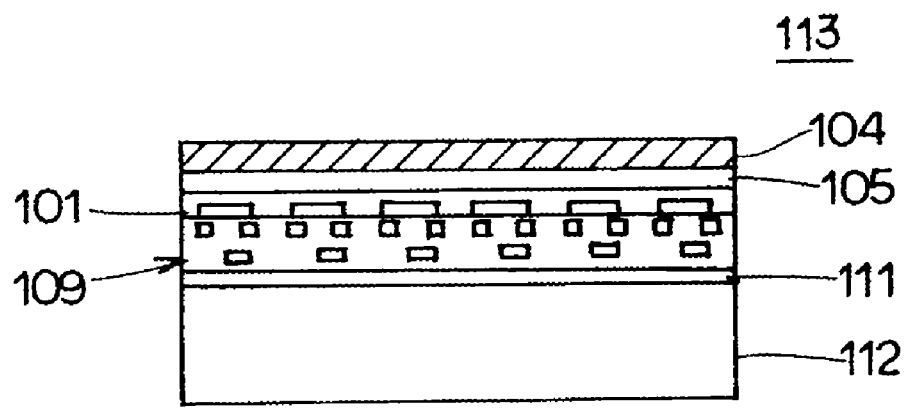
[Fig. 4g]
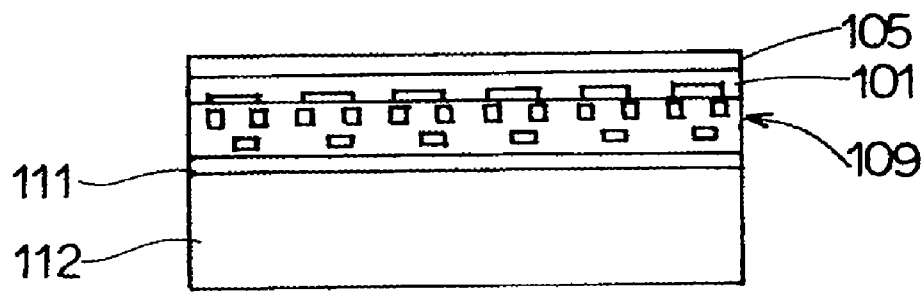
[Fig. 4h]
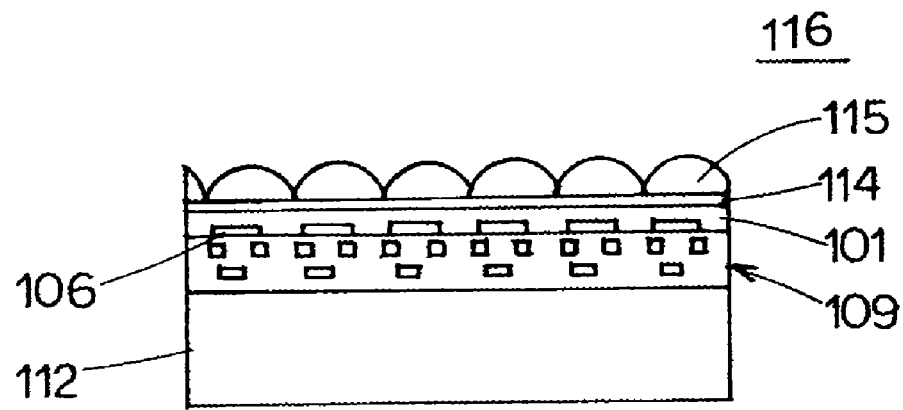

METHOD OF CONTROLLING FILM THINNING OF SEMICONDUCTOR WAFER FOR SOLID-STATE IMAGE SENSING DEVICE

BACKGROUND OF THE INVENTION

1. Field of the Invention

The present invention relates to a method of controlling film thinning of a semiconductor wafer for a solid-state image sensing device. More specifically, the present invention relates to a method of controlling film thinning of a semiconductor wafer for a solid-state image sensing device in a back-illuminated type solid-state image pick-up apparatus in which a solid-state image sensing device is formed on a surface layer of a semiconductor wafer and light is made incident from a rear surface side that is opposite to the side where the solid-state image sensing device is formed.

2. Description of the Related Art

In a front-illuminated type CMOS solid-state image pick-up apparatus, there is multi-layer wiring in a light path of an incident light, especially in a light path of a gradient light in a periphery portion of an effective pixel area. Therefore, it is known that since the multi-layer wiring blocks light penetration, efficiency of light utilization is undermined and sensitivity also decreases. As a conventional technology directed to resolving this problem, a back-illuminated type CMOS solid-state image pick-up apparatus has been developed in which multi-layer wiring is formed on a front surface side of a silicon wafer and light is made incident from a rear surface side of the silicon wafer (for examples, Related Arts 1-3).

In the following, with reference to a flow sheet of FIG. 4, a manufacturing method of a conventional back-illuminated type solid-state image pick-up apparatus disclosed in FIGS. 6-8 of Related Art 2 is explained.

First, an epitaxial SOI wafer 102 is prepared in which an epitaxial film 101 is formed on a surface of an SOI wafer 100 (FIG. 4a). In the SOI wafer 100, an active layer 105 is formed on a surface of a silicon wafer 103 via an embedded silicon oxide film ($SiO_2$ film) 104, the active layer 105 being a thin film and the silicon wafer 103 being made of a silicon single crystal. The epitaxial film 101 is epitaxially grown on a surface of the active layer 105.

Next, a pixel separation area portion of an image pick-up area, a semiconductor well area portion, and a photo diode 106 as a photo sensor, are formed in the epitaxial film 101 from a front surface side thereof (FIG. 4b).

After that, a source-drain area that constitutes a plurality of MOS transistors for reading out a signal charge is formed on each unit pixel cell of the epitaxial film 101, and a gate electrode is formed via a gate insulator film. Next, a source-drain area that constitutes another CMOS transistor is formed on a peripheral circuit portion, and a gate electrode is formed via a gate insulator film. Further, on the surface of the epitaxial film 101, a multi-layer wiring layer 109 is formed in which a multi-layer wiring 108 is formed in an interlayer insulator film 107.

Next, on the surface of the multi-layer wiring layer 109, an adhesive layer 110, which is made of a silicon oxide film, is formed. A Chemical Mechanical Polishing is applied to the surface of the adhesive layer 110 to planarize the surface of the adhesive layer 110 (FIG. 4c). The epitaxial film 101, which has the photo diode 106 and the like formed therein, and the multi-layer wiring layer 109 constitute a solid-state image sensing device 117 of a CMOS type.

After that, a support substrate 112, which is made of single crystal silicon and has another adhesive layer 111 (which is made of silicon oxide film) formed on a bonding interface side, is bonded to the surface of the multi-layer wiring layer 109 to form a bonded wafer 113 (FIG. 4d).

After that, the bonded wafer 113 is flipped over, and the silicon wafer 103 is ground by using a grinding wheel until a residual thickness of 10-30 μm is reached (FIG. 4e).

After that, by using the embedded silicon oxide film 104 as an etching stop layer, the residual portion of the silicon wafer 103 is removed by etching with a KOH solution (FIG. 4f). Using a KOH solution as an etching solution allows a selectivity between the silicon wafer 103 and the embedded silicon oxide film 104 to increase to $Si:SiO_2=100:1$ or above. As a result, it is possible to etch the silicon wafer 103 at a rate of 0.2-10 μm/min, and use the embedded silicon oxide film 104 as an etching stop layer.

After that, film thinning is performed by removing the embedded silicon oxide film 104 with a hydrofluoric acid so as to expose the rear surface of the active layer 105 (FIG. 4g).

Next, a pad aperture is formed at a required location of the active layer 105, and a terminal area is formed which includes interior portion of the aperture and connects to wiring. After that, a color filter 114 and a micro lens 115 are sequentially formed at a location corresponding to the photo diode 106 of each pixel (FIG. 4h). By doing this, a CMOS solid-state image pick-up apparatus 116 of a back-illuminated type is manufactured.

[Related Art 1] Japanese Patent Laid-Open Publication No. 2008-258201
[Related Art 2] Japanese Patent No. 4046067
[Related Art 3] Japanese Patent Laid-Open Publication No. 2005-353996

In this way, according to the method of Related Art 2, first, in the SOI wafer 100, the CMOS solid-state image sensing device 117 is fabricated from the interior of the epitaxial film 101 across the surface thereof. After that, the support substrate 112 is bonded to the rear surface side of the silicon wafer 103. Next, by using an etching stop method, the silicon wafer 103 is thinned until a necessary thickness is reached, and the CMOS solid-state image sensing device 117 is repositioned on the support substrate 112.

According to this method, it is possible to accommodate a request from the device manufacturing sector in recent years regarding reduction in thickness variation of the CMOS solid-state image sensing device 117. When thickness variation occurs, variation in incident intensity of light incident to the CMOS solid-state image sensing device 117 occurs, and it is possible for color unevenness to occur. However, the conventionally used epitaxial SOI wafer 102, in which the epitaxial film 101 is formed on the thin film active layer 105, was expensive. Furthermore, since the epitaxial film 101 is formed on the thin film active layer 105, defects such as slips and the like occur frequently, as compared to the case in which an epitaxial film is formed on a single layer silicon wafer.

In order to solve this problem, a method is developed in which, in place of an SOI wafer, an epitaxial silicon wafer, in which two layers of epitaxial films are formed on the surface of a silicon wafer, is used, and film thinning of the silicon wafer is performed by using etching stop. However, according to this method, although an ideal dopant concentration ratio can be maintained at an early stage of the use of the CMOS solid-state image pick-up apparatus 116, impurity diffusion occurs when a device heat treatment or the like is applied. Therefore, the dopant concentration ratio is no longer suitable for etching stop, and a gradual concentration gradient is generated, and thus, a nonuniform etching is being carried out, which resulted in the above described thickness variation problem of the CMOS solid-state image sensing device 117.

Further, as another conventional technology directed to reduction in thickness variation of a CMOS image sensing device, as disclosed in Related Art 3, a method has been developed in which an end-point detector (polishing stop layer) is formed on the surface of the semiconductor substrate as an embedded layer of a material that is different from the semiconductor substrate. The semiconductor substrate is subjected to film thinning by polishing the semiconductor substrate from the rear surface thereof until a position facing the end-point detector is reached. After that, a solid-state image sensing device is formed on the front surface side of the semiconductor substrate, and a support substrate is bonded to the front surface side of the semiconductor substrate. By doing this, a semiconductor apparatus including a back-illuminated type solid-state image sensing device is manufactured. However, in this method, an end-point detector, which is a polishing stop layer, has to be made, which increases the number of processes and results in high cost.

BRIEF SUMMARY OF THE INVENTION

To address the above described problems, the inventors of the present invention have conducted intensive studies, and have accomplished the present invention by finding that all above described problems can be resolved when the following configuration is adopted. That is, the present invention provides a method of controlling film thinning of a semiconductor wafer for a solid-state image sensing device that includes the following. First, a solid-state image sensing device is formed on a surface layer of a silicon wafer, instead of an SOI wafer. After that, a support substrate is bonded to the surface of the solid-state image sensing device to make a bonded wafer. Next, the silicon wafer is ground from the rear surface side thereof until a position near the solid-state image sensing device is reached to make a wafer layer (semiconductor wafer layer). After that, the wafer layer is mirror finished by polishing or the like, and the residual thickness of the wafer layer, extending from the mirror-finished surface to the solid-state image sensing device, is measured. After that, based on the obtained residual thickness data, the wafer layer is plasma etched from the mirror-finished surface until a predetermined thickness is reached by controlling plasma etching amount, and is thereby planarized.

The present invention provides a method of controlling film thinning of a semiconductor wafer for a solid-state image sensing device that allows a back-illuminated type solid-state image pick-up apparatus having a solid-state image sensing device with a reduced thickness variation, to be manufactured at low cost without causing an increase in the number of processes.

Further, the present invention provides a method of controlling film thinning of a semiconductor wafer for a solid-state image sensing device in which it is difficult for defects such as slips to occur in an epitaxial film, as compared to the case where an epitaxial film is formed on an active layer of an SOI wafer.

The present invention is a method of controlling film thinning of a semiconductor wafer for a solid-state image sensing device. In this method, the solid-state image sensing device is formed in a surface layer of the semiconductor wafer. After that, a support substrate is bonded to a surface of the semiconductor wafer to make a bonded wafer. After the bonding, the semiconductor wafer is ground from a rear surface side of the semiconductor wafer while leaving a semiconductor wafer layer on the solid-state image sensing device. After the grinding, the grinding surface of the semiconductor wafer layer is mirror finished by polishing or etching. The thickness extending from the mirror-finished surface of the semiconductor wafer layer to the solid-state image sensing device is measured, and residual thickness data is obtained. Based on the residual thickness data, the semiconductor wafer layer is plasma etched from the mirror-finished surface of the semiconductor wafer layer until a predetermined thickness is reached by controlling plasma etching amount, and is thereby planarized.

According to the present invention, first, a solid-state image sensing device is formed in a surface layer of the semiconductor wafer. Next, a support substrate is bonded to a surface of the semiconductor wafer to make a bonded wafer. After that, the semiconductor wafer is ground from a rear surface side of the semiconductor wafer while leaving a semiconductor wafer layer on the solid-state image sensing device. After that, the grinding surface of the semiconductor wafer layer is mirror finished by polishing or etching. After that, the thickness extending from the mirror-finished surface to the solid-state image sensing device is measured. Based on the obtained residual thickness data, the semiconductor wafer layer is plasma etched from the mirror-finished surface of the semiconductor wafer layer until a predetermined thickness is reached by controlling plasma etching amount.

The thickness that is important for a back-illuminated type solid-state image sensing device is the thickness extending from the processed surface to the solid-state image sensing device. Here the important point is not the thickness extending from the bonding interface to the solid-state image sensing device, but the thickness extending from the processed surface (the mirror-finished surface of the semiconductor wafer layer) to the solid-state image sensing device.

In this way, in place of film thinning of a conventional expensive SOI wafer that involves etching stop, the method is adopted in which the thickness extending from the mirror-finished surface of the semiconductor wafer layer to the solid-state image sensing device is measured, and, based on the obtained residual thickness data, the semiconductor wafer layer is plasma etched from the mirror-finished surface until a predetermined thickness is reached by controlling plasma etching amount. Thereby, a back-illuminated type solid-state image pick-up apparatus having a solid-state image sensing device with a reduced thickness variation can be manufactured at low cost without causing an increase in the number of processes.

As a semiconductor wafer, a single crystal silicon wafer can be adopted.

The semiconductor wafer can be made to have a predetermined resistivity by adding a p-type dopant (such as B) or an n-type dopant (such as P, As, and Sb).

As a solid-state image sensing device, for example, a CMOS type device can be adopted. Other devices, such as a CCD type device can also be adopted. Here, the solid-state image sensing device includes an epitaxial film and a multi-layer wiring layer, the epitaxial film having a pixel separation area portion of an image pick-up area, a semiconductor well area portion and a photo diode formed therein.

As a material for a support substrate, for example, a single crystal silicon wafer, a glass substrate, or the like, can be adopted.

A silicon oxide film may be laminated as an adhesive layer on a bonding interface of a support substrate.

A semiconductor wafer layer is a layered portion formed through film thinning of a semiconductor wafer by grinding or the like.

In grinding of a semiconductor wafer, a rear surface (the surface that is opposite to the bonding surface) of the semiconductor is roughly ground with, for example, a #320 resinoid grinding wheel, and then is finish ground with a #2000 resinoid grinding wheel.

The residual thickness of the semiconductor wafer layer after grinding is 10-30 μm. When the thickness is under 10 μm, grinding damage may reach the device formation layer. When the thickness is above 30 μm, etching time for film thinning becomes longer.

Method for mirror finishing the ground surface of the semiconductor wafer layer is polishing (mirror polishing) or etching (mirror etching) or a combination thereof. The flatness of the mirror-finished surface of the semiconductor wafer layer, in terms of the variation in the thickness of the semiconductor wafer layer extending to the solid-state image sensing device, is 0.5-2 μm in the accuracy of current grinding technology. When the flatness is above 2 μm, plasma etching time becomes longer, and the accuracy of the flatness may deteriorate.

As a method for measuring the residual thickness of the semiconductor wafer layer, for example, FTIR, optical interferometry, ellipsometry, or the like, can be adopted.

The "predetermined thickness" is the thickness (depth) of the remaining semiconductor wafer layer having a thickness of 2-7 μm after plasma etching.

As a plasma etching, DCP (dry chemical planarization) can be adopted. DCP is an etching process that uses a sulfur hexafluoride ($SF_6$) gas plasma.

Further, in the present invention, it is desirable that plasma moving speed along the mirror-finished surface is changed according the thickness of an uneven portion of the mirror-finished surface. When the plasma moving speed is slower at a location where the uneven portion is thick and is faster at a location where the uneven portion is thin, variation in the thickness of the semiconductor wafer layer, extending to the solid-state image sensing device, can be reduced. As a result, inter-element performance variation can be suppressed.

Further, in the present invention, it is desirable that the semiconductor wafer is an epitaxial silicon wafer having a single layer epitaxial film formed on a surface thereof, and the solid-state image sensing device is formed in a surface layer of the epitaxial film. In this way, since an epitaxial silicon wafer having a single layer epitaxial film formed on a surface thereof is adopted as the semiconductor wafer, it is not necessary to form an epitaxial film in a thin film active layer as in the conventional method in which an SOI wafer is used. As a result, it is difficult for defects such as slips to occur in an epitaxial film, and a high quality epitaxial film can be obtained.

As a material for an epitaxial film, for example, a single crystal silicon can be adopted.

As a method for forming an epitaxial film, any one of a vapor phase epitaxial method, a liquid phase epitaxial method and a solid phase epitaxial method can be adopted. Of these, as a vapor phase epitaxial method, for example, an atmospheric pressure vapor phase epitaxial method, a reduced-pressure vapor phase epitaxial method, a metalorganic vapor phase epitaxial method, or the like, can be adopted. In a vapor phase epitaxial method, for example, a susceptor is used to house an epitaxial silicon wafer laterally (in a state in which front and rear surfaces are placed horizontally) in a wafer housing unit, the susceptor having a circular shape from a plan view and being mountable with a single wafer or a plurality of wafers. A vapor phase epitaxial method can be a homoepitaxy in which a material that is the same as the wafer is epitaxially grown, or a heteroepitaxy in which a material that is different from the wafer (such as GaAs) is epitaxially grown.

The thickness of an epitaxial film is 10 μm or less, optimally, 2-7 μm. When the thickness is above 10 μm, cost increases.

The epitaxial film can be made to have a predetermined resistivity by adding a p-type dopant or an n-type dopant.

Further, in the present invention, it is desirable that the plasma etched surface of the semiconductor wafer layer is final polished. In this way, when the plasma etched surface of the semiconductor wafer layer is final polished, the flatness of the plasma etched surface can be further improved.

In the final polishing, for example, an apparatus that final polishes one side is used. That is, a non-woven fabric for final polishing is used, and the polishing amount is about 0.01-1 μm.

Further, in the present invention, it is desirable that the flatness of the plasma etched surface of the semiconductor wafer layer, in terms of the variation in the thickness of the semiconductor wafer layer extending to the solid-state image sensing device, is 0.5 μm or less. By doing this, inter-element performance variation can be suppressed.

When the flatness of the plasma etched surface of the semiconductor wafer layer, in terms of the variation in the thickness, is above 0.5 μm, correction to the flatness of the plasma etched surface in a post-process is difficult to make, and inter-element performance variation increases. It is desirable that the flatness of the plasma etched surface of the semiconductor wafer layer, in terms of the variation in the thickness of the semiconductor wafer layer, is as small as possible, for example, 0.2 μm or less.

Further, in the present invention, it is desirable that, after the plasma etching, the thickness of the semiconductor wafer layer, extending to the solid-state image sensing device, is 2-7 μm. In this way, since the thickness of the semiconductor wafer layer, after plasma etching or plasma etching followed by polishing, is 2-7 μm, film thinning can be uniformly performed according to the thickness of the solid-state image sensing device.

After plasma etching, when the thickness of the semiconductor wafer layer is less than 2 μm, sensitivity is degraded for a high wavelength; and when the thickness is above 7 μm, sensitivity is degraded for a short wavelength.

BRIEF DESCRIPTION OF THE SEVERAL VIEWS OF THE DRAWINGS

FIG. 1a is a vertical cross-sectional view illustrating a process of forming an epitaxial film on a base substrate in a method of controlling film thinning of a semiconductor wafer for a solid-state image sensing device according to a first embodiment of the present invention.

FIG. 1b is a vertical cross-sectional view illustrating a process of forming a solid-state image sensing device in the method of controlling film thinning of a semiconductor wafer for a solid-state image sensing device according to the first embodiment of the present invention.

FIG. 1c is a vertical cross-sectional view illustrating a process of forming an adhesive layer on a multi-layer wiring layer in the method of controlling film thinning of a semiconductor wafer for a solid-state image sensing device according to the first embodiment of the present invention.

FIG. 1d is a vertical cross-sectional view illustrating a process of bonding the base substrate and a support substrate in the method of controlling film thinning of a semiconductor wafer for a solid-state image sensing device according to the first embodiment of the present invention.

FIG. 1e is a vertical cross-sectional view illustrating a grinding process and a polishing process of the base substrate in the method of controlling film thinning of a semiconductor wafer for a solid-state image sensing device according to the first embodiment of the present invention.

FIG. 1f is a vertical cross-sectional view illustrating a process of measuring the thickness of the polished surface of the base substrate and performing plasma etching in the method of controlling film thinning of a semiconductor wafer for a solid-state image sensing device according to the first embodiment of the present invention.

FIG. 1g is a vertical cross-sectional view illustrating a process of forming a color filter and a micro lens on the plasma etched surface of the base substrate in the method of controlling film thinning of a semiconductor wafer for a solid-state image sensing device according to the first embodiment of the present invention.

FIG. 2 is a schematic front view of a DCP apparatus used in the method of controlling film thinning of a semiconductor wafer for a solid-state image sensing device according to the first embodiment of the present invention.

FIG. 3 is an enlarged sectional view of a substantial part illustrating the plasma etching process of a semiconductor wafer in the method of controlling film thinning of a semiconductor wafer for a solid-state image sensing device according to the first embodiment of the present invention.

FIG. 4a is a vertical cross-sectional view illustrating a process of forming an epitaxial film on an SOI wafer in a method of controlling film thinning of a semiconductor wafer for a solid-state image sensing device according to a conventional technology.

FIG. 4b is a vertical cross-sectional view illustrating a process of forming a solid-state image sensing device in the method of controlling film thinning of a semiconductor wafer for a solid-state image sensing device according to the conventional technology.

FIG. 4c is a vertical cross-sectional view illustrating a process of forming an adhesive layer on a multi-layer wiring layer in the method of controlling film thinning of a semiconductor wafer for a solid-state image sensing device according to the conventional technology.

FIG. 4d is a vertical cross-sectional view illustrating a process of bonding the SOI wafer and a support substrate in the method of controlling film thinning of a semiconductor wafer for a solid-state image sensing device according to the conventional technology.

FIG. 4e is a vertical cross-sectional view illustrating a process of grinding the SOI wafer in the method of controlling film thinning of a semiconductor wafer for a solid-state image sensing device according to the conventional technology.

FIG. 4f is a vertical cross-sectional view illustrating a process of removing a silicon wafer that constitutes a portion of the SOI wafer by using an etching stop method in the method of controlling film thinning of a semiconductor wafer for a solid-state image sensing device according to the conventional technology.

FIG. 4g is a vertical cross-sectional view illustrating a process of removing an embedded silicon oxide film that constitutes a portion of the SOI wafer by using the etching stop method in the method of controlling film thinning of a semiconductor wafer for a solid-state image sensing device according to the conventional technology.

FIG. 4h is a vertical cross-sectional view illustrating a process of forming a color filter and a micro lens on the surface of an active layer that constitutes a portion of the SOI wafer in the method of controlling film thinning of a semiconductor wafer for a solid-state image sensing device according to the conventional technology.

DETAILED DESCRIPTION OF THE INVENTION

In the following, the embodiment of the present invention is specifically explained.

Embodiment

In the following, with reference to a flow sheet of FIG. 1, a method of manufacturing a back-illuminated type solid-state image pick-up apparatus utilizing a method of controlling film thinning of a semiconductor wafer for a solid-state image sensing device according to a first embodiment of the present invention is explained.

First, an epitaxial silicon wafer 10 is prepared (FIG. 1a).

The epitaxial silicon wafer 10 has a base substrate (semiconductor wafer) 11 as a main body, the base substrate 11 being obtained by processing a single crystal pulled by a CZ method, having a diameter of 300 mm, and having a resistivity of 1.0 Ω·cm by boron doping. The epitaxial silicon wafer 10 is a wafer of a two-layer structure in which an one-layer epitaxial film 12 is formed only on a surface of the base substrate 11, the epitaxial film 12 being formed from a single crystal silicon by using a vapor phase epitaxial method.

When the epitaxial film 12 is formed, a single-wafer vapor phase epitaxial growth apparatus is used. The vapor phase epitaxial growth apparatus has a susceptor horizontally arranged in a central region of a chamber, the susceptor having a circular shape from a plan view and having one base substrate 11 mounted therein, and the chamber having heaters arranged above and below. On one side of the chamber, a gas inlet is formed to flow a carrier gas ($H_2$ gas) and a source gas ($SiHCl_3$ gas) into an upper space of the chamber in a direction parallel to the surface of the wafer. On another side of the chamber, a gas outlet is formed.

When epitaxial growth is performed, the base substrate 11 is mounted in the susceptor, and the epitaxial film 12 is grown on the surface of the base substrate 11. More specifically, the carrier gas and the source gas are introduced into a reaction furnace though the corresponding gas inlet. With pressure in the furnace being set at 100±20 KPa, silicon generated from thermal decomposition or reduction of the source gas is deposited at a reaction rate of 3.5-4.5 μm/minute onto the surface of the base substrate 11, the base substrate 11 having a temperature of 1000-1150° C. By doing this, the epitaxial film 12 is formed on the surface of the base substrate 11, the epitaxial film 12 being a silicon single crystal and having a thickness of about 5 μm. In this way, the epitaxial silicon wafer 10 is prepared.

Next, a pixel separation area portion of an image pick-up area, a semiconductor well area portion, and a photo diode (solid-state image sensing device) 13 as a photo sensor, are formed in the epitaxial film 12 from a front surface side thereof (FIG. 1b). Specifically, the photo diode 13 and a plurality of MOS transistors are formed corresponding to each pixel area portion in the image pick-up area portion of the epitaxial film 12, and a CMOS transistor is formed in a peripheral circuit portion in a peripheral area. Further, on the surface of the epitaxial film 12, a multi-layer wiring layer 16 is formed in which a multi-layer wiring 15 is embedded in an interlayer insulator film 14.

After that, on the bonding interface side surface of the multi-layer wiring layer 16, an adhesive layer 17, which is a silicon oxide film having a thickness of 0.2 µm, is formed by using, for example, a reduced-pressure CVD method (FIG. 1c). The epitaxial film 12, which has the photo diode 13 and the like formed therein, and the multi-layer wiring layer 16, constitute a solid-state image sensing device 40 of a CMOS type.

After that, Chemical Mechanical Polishing is applied to the surface of the adhesive layer 17 to increase the flatness of the surface of the adhesive layer 17, which is to be bonded.

After that, a support substrate 19, which is made of a single crystal silicon wafer, is bonded to the surface of the multi-layer wiring layer 16, which is formed on the base substrate 11 (FIG. 1d).

In this case, first, the support substrate 19 is prepared in which another adhesive layer 18 is formed on the surface on the side to be bonded with the multi-layer wiring layer 16, the adhesive layer 18 being made of a silicon oxide film. The support substrate 19 is a silicon wafer identical to the base substrate 11.

As a specific bonding method, the surfaces of the adhesive layers 17 and 18 are first exposed to a nitrogen plasma, and then are put in contact to each other at a normal temperature so as to bond the multi-layer wiring layer 16 and the support substrate 19. By doing this, a bonded wafer 20 is obtained. After that, the bonded wafer 20 is inserted into a thermal oxidation furnace to perform a bonding heat treatment so as to enhance the bonding strength. When doing this, the heating temperature of the bonding heat treatment is 350° C. The time of the bonding heat treatment is 8 hours. Oxygen is used as the atmosphere gas in the thermal oxidation furnace.

Next, the bonded wafer 20 is flipped over, and film thinning is performed on the base substrate 11 by grinding the base substrate 11 from the side opposite to the bonding side to make a wafer layer (semiconductor wafer layer) 11A (FIG. 1e). Here, a rough grinding is performed using a #320 resinoid grinding wheel, and then a finish grinding is performed using a #2000 resinoid grinding wheel. After the grinding, the wafer layer 11A has a thickness of 15 µm.

After that, polishing is performed on the ground surface of the wafer layer 11A using a final polishing apparatus to mirror finish the ground surface. As the final polishing apparatus, a non-woven fabric for final polishing is used, in which a foaming surface layer is formed on the surface of a flexible plastic foam. Here, the polishing amount is 9 µm.

After that, the thickness extending from the mirror-finished surface of the wafer layer 11A to the photo diode 13 (the interface between the epitaxial film 12 and the multi-layer wiring layer 16) is measured, and residual thickness data is obtained. For the residual thickness measurement, an Acumap measurement apparatus made by KLA Tencor Corporation is used.

Next, based on the measured residual thickness data (about 6 µm), the wafer layer 11A is plasma etched from the mirror-finished surface until it reaches just before (a residual thickness of about 5 µm) the interface between the wafer layer 11A and the epitaxial film 12 (FIG. 1f). After the plasma etching, the flatness of the plasma-etched surface of the wafer layer 11A is improved to the extent that the variation in the thickness of the wafer layer 11A, extending to the solid-state image sensing device 40, is about 0.1 µm.

For the plasma etching, a DCP (Dry Chemical Planarization) apparatus made by SpeedFam Company Limited is used. The DCP apparatus, as compared to a common plasma etching apparatus, has an advantage in that it allows localized etching control by using a small-diameter head.

In the following, with reference to FIG. 2 and FIG. 3, the configuration of a DCP apparatus 50 and a plasma etching method using the DCP apparatus 50 are specifically explained.

The DCP apparatus 50, which is illustrated in FIG. 2, applies plasma assisted chemical etching to the mirror-finished surface of the wafer layer 11A. In this plasma etching, while an etching gas of $SF_6$ is flown at a rate of 100-1000 cc/minute into etching reaction furnace St, which is negatively pressurized by suction pumps P1 and P2, a microwave having a frequency of 2.45 GHz and a power of 300-600 W is continuously applied by using a microwave power source 51. By doing this, from a plasma discharge tube 52, the etching gas of $SF_6$ is excited and a plasma is generated. More specifically, the etching gas of $SF_6$ receives plasma energy inside the plasma discharge tube 52 and becomes chemically activated.

After that, a chuck 53, which holds the bonded wafer 20, is moved along the mirror-finished surface of the wafer layer 11A with a moving speed that changes according to the thickness of the uneven portion (undulating portion) of the mirror-finished surface (FIG. 3). By doing this, radical species 54, which are excited by plasma, are sequentially supplied to predetermined locations of the wafer layer 11A. As a result, silicon under a plasma area is etched at an etching rate of about 1 µm/second and etching amount of 1-5 µm according to the thickness (for example, 1-5 µm) of the uneven portion. When doing this, based on the residual thickness data, other portions of the mirror-finished surface of the wafer layer 11A are also successively plasma etched. By doing this, convexo-concave is completely removed from the entire plasma etched surface of the wafer layer 11A. The symbol A(B) in FIG. 2 represents a thickness measurement instrument of the bonded wafer 20.

In this way, in the first embodiment, in place of film thinning of a conventional expensive SOI wafer that involves etching stop, the method is adopted in which the thickness extending from the mirror-finished surface of the wafer layer 11A to the photo diode 13 is measured, and based on the obtained residual thickness data, plasma etching using DCP is performed to etch the wafer layer 11A from the mirror-finished surface of the wafer layer 11A until a predetermined thickness is reached by controlling the plasma etching amount through changing moving speed of the plasma along the mirror-finished surface of the wafer layer 11A. By doing this, a back-illuminated type solid-state image pick-up apparatus 30, described below, having the solid-state image sensing device 40 with a reduced thickness variation, can be manufactured at low cost without causing an increase in the number of processes as compared to the conventional method. As a result, it is possible to reduce variation in incident intensity of light incident to the solid-state image sensing device 40 and prevent color unevenness.

After that, the plasma etched surface of the wafer layer 11A is final polished by using a final polishing apparatus, which uses the non-woven fabric for final polishing. Here, the polishing amount is 0.1 µm. By doing this, it is possible to further improve the flatness of the plasma etched surface.

Next, on the rear surface of the wafer layer 11A, which has been made a thin film, a passivation film such as a silicon nitride film or a silicon oxide film is formed by using a plasma CVD method.

After that, at a required location in a formation area of a solid-state image sensing device in the wafer layer 11A, an aperture for pad (terminal) lead-out for the purpose of connecting to the multi-layer wiring 15 is formed. A pad is formed through the aperture.

After that, a color filter 21 of a corresponding color is formed at a location corresponding to each photo diode 13, and a micro lens 22 is formed above the color filter 21. By doing this, a back-illuminated type solid-state image pick-up apparatus 30 is manufactured (FIG. 1g).

In this way, since a single-layer type silicon wafer is used as the base substrate 11, as compared to the case where an expensive SOI wafer is used, it is possible to reduce the cost of the back-illuminated type solid-state image pick-up apparatus 30. Furthermore, a high quality epitaxial film 12 can be obtained without the need of forming an epitaxial film in the active layer of an SOI wafer as required in a conventional method.

With respect to the back-illuminated type solid-state image pick-up apparatus 30 of the first embodiment, an experiment is actually performed to measure the variation in the thickness of the solid-state image sensing device 40 within the surface area of the silicon wafer, and the results of the experiment are reported here.

As the measurement apparatus, an Acumap made by KLA Tencor Corporation was used. The results are as follows. The thickness variation, within the surface area of the wafer, is less than 0.1 µm. Therefore, without using an expensive SOI wafer, good film thickness uniformity was obtained. Further, the thickness of the semiconductor wafer layer, extending to the solid-state image sensing device, was 4 µm. Therefore, an effect that only a high quality epitaxially grown layer remains was obtained.

INDUSTRIAL APPLICABILITY

The present invention is useful for manufacturing a back-illuminated type CMOS image sensor and the like.

What is claimed is:

1. A method of controlling film thinning of a semiconductor wafer for a solid-state image sensing device, comprising:
    forming the solid-state image sensing device in a surface layer of the semiconductor wafer;
    bonding, thereafter, a support substrate to a surface of the semiconductor wafer to make a bonded wafer;
    grinding, after the bonding, the semiconductor wafer from a rear surface side of the semiconductor wafer while leaving a semiconductor wafer layer on the solid-state image sensing device;
    mirror-finishing, after the grinding, the ground surface of the semiconductor wafer layer by one of polishing and etching;
    measuring thickness extending from the mirror-finished surface of the semiconductor wafer layer to the solid-state image sensing device, and obtaining residual thickness data; and
    plasma etching, based on the residual thickness data, the semiconductor wafer layer from the mirror-finished surface of the semiconductor wafer layer until a predetermined thickness is reached by controlling the plasma etching amount.

2. The method of controlling film thinning of a semiconductor wafer for a solid-state image sensing device according to claim 1, wherein
    plasma moving speed along the mirror-finished surface is changed according to the thickness of an uneven portion of the mirror-finished surface.

3. The method of controlling film thinning of a semiconductor wafer for a solid-state image sensing device according to claim 1, wherein
    the semiconductor wafer is an epitaxial silicon wafer having a single layer epitaxial film formed on a surface thereof; and
    the solid-state image sensing device is formed in a surface layer of the epitaxial film.

4. The method of controlling film thinning of a semiconductor wafer for a solid-state image sensing device according to claim 1, wherein
    the plasma etched surface of the semiconductor wafer layer is final polished.

5. The method of controlling film thinning of a semiconductor wafer for a solid-state image sensing device according to claim 1, wherein
    flatness of the plasma etched surface of the semiconductor wafer layer, in terms of variation in the thickness of the semiconductor wafer layer, extending to the solid-state image sensing device, is 0.5 µm or less.

6. The method of controlling film thinning of a semiconductor wafer for a solid-state image sensing device according to claim 1, wherein
    after the plasma etching, the thickness of the semiconductor wafer layer, extending to the solid-state image sensing device, is 2-7 µm.

* * * * *